(12) United States Patent
Lilak et al.

(10) Patent No.: US 11,776,898 B2
(45) Date of Patent: Oct. 3, 2023

(54) SIDEWALL INTERCONNECT METALLIZATION STRUCTURES FOR INTEGRATED CIRCUIT DEVICES

(71) Applicant: Intel Corporation, Santa Clara, CA (US)

(72) Inventors: Aaron Lilak, Beaverton, OR (US);
Anh Phan, Beaverton, OR (US);
Gilbert Dewey, Beaverton, OR (US);
Willy Rachmady, Beaverton, OR (US);
Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 16/955,722

(22) PCT Filed: Feb. 22, 2018

(86) PCT No.: PCT/US2018/019232
§ 371 (c)(1),
(2) Date: Jun. 18, 2020

(87) PCT Pub. No.: WO2019/164494
PCT Pub. Date: Aug. 29, 2019

(65) Prior Publication Data
US 2020/0411433 A1 Dec. 31, 2020

(51) Int. Cl.
*H01L 23/522* (2006.01)
*H01L 23/528* (2006.01)
(Continued)

(52) U.S. Cl.
CPC .... *H01L 23/5226* (2013.01); *H01L 21/76832* (2013.01); *H01L 21/76897* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 10,083,963 B2 * 9/2018 Goktepeli ........... H01L 27/1211
10,192,819 B1 * 1/2019 Chanemougame ... H01L 21/743
(Continued)

OTHER PUBLICATIONS

International Search Report & Written Opinion notified Nov. 22, 2018 for PCT Patent Application No. PCT/US18/19232.
(Continued)

*Primary Examiner* — Younes Boulghassoul
(74) *Attorney, Agent, or Firm* — Essential Patents Group, LLP

(57) ABSTRACT

Interconnect metallization of an integrated circuit device includes a sidewall contact between conductive features. In a stacked device, a terminal interconnect of one device layer may intersect a sidewall of a conductive feature in another device layer or between two devices layers. In some examples, a terminal interconnect coupled to a gate, source, or drain terminal of a finFET in a vertically-stacked device may extend to a depth below a plane of the fin and intersect a sidewall of another interconnect, or another device terminal, that is in another plane of the stacked device. A stop layer below a top surface of the conductive feature may allow for sidewall contact while avoiding interconnect shorts.

12 Claims, 9 Drawing Sheets

(51) Int. Cl.
*H01L 27/088* (2006.01)
*H01L 29/06* (2006.01)
*H01L 29/78* (2006.01)
*H01L 23/532* (2006.01)
*H01L 27/06* (2006.01)
*H01L 21/8234* (2006.01)
*H01L 29/66* (2006.01)
*H01L 21/768* (2006.01)
*H01L 21/822* (2006.01)

(52) U.S. Cl.
CPC ........... H01L 21/823431 (2013.01); H01L 21/823475 (2013.01); H01L 23/5283 (2013.01); H01L 23/53295 (2013.01); H01L 27/0886 (2013.01); H01L 29/0638 (2013.01); H01L 29/66795 (2013.01); H01L 29/785 (2013.01); H01L 21/8221 (2013.01); H01L 27/0688 (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 23/5226; H01L 23/53295; H01L 23/5283; H01L 23/481; H01L 21/823475; H01L 21/823871; H01L 21/76897; H01L 21/76802–76805; H01L 21/76816; H01L 21/76877; H01L 21/8221; H01L 27/0688; H01L 29/78696; H01L 29/42392; H01L 29/0673; H01L 29/66439; H01L 29/775; H01L 23/528
See application file for complete search history.

(56) References Cited

U.S. PATENT DOCUMENTS

| | | | |
|---|---|---|---|
| 2005/0263894 A1 | 12/2005 | Huber et al. | |
| 2007/0267723 A1* | 11/2007 | Bernstein | H01L 27/0688 257/621 |
| 2008/0067554 A1* | 3/2008 | Jeong | H01L 27/11521 257/211 |
| 2008/0182407 A1* | 7/2008 | Zhai | H01L 23/53238 257/E23.145 |
| 2009/0001594 A1* | 1/2009 | Yoo | H01L 23/53295 257/773 |
| 2014/0332963 A1 | 11/2014 | Fillippi et al. | |
| 2016/0126183 A1 | 5/2016 | Chen et al. | |
| 2016/0365271 A1 | 12/2016 | Chang et al. | |
| 2017/0062421 A1* | 3/2017 | Cosemans | H01L 21/76895 |
| 2017/0110569 A1* | 4/2017 | Chang | H01L 21/76807 |
| 2017/0186685 A1 | 6/2017 | Yang et al. | |
| 2018/0248012 A1* | 8/2018 | Morrow | H01L 29/41775 |
| 2019/0013241 A1* | 1/2019 | Xie | H01L 21/823475 |
| 2019/0067091 A1* | 2/2019 | Morrow | H01L 21/76805 |
| 2020/0273779 A1* | 8/2020 | Lilak | H01L 21/823431 |

OTHER PUBLICATIONS

International Preliminary Report on Patentability from PCT/US2018/019232 notified Sep. 3, 2020, 8 pgs.

* cited by examiner

SIDEWALL INTERCONNECT METALLIZATION STRUCTURES FOR INTEGRATED CIRCUIT DEVICES

CLAIM OF PRIORITY

This Application is a National Stage Entry of, and claims priority to, PCT Patent Application No. PCT/US2018/019232, filed on Feb. 22, 2018 and titled "SIDEWALL INTERCONNECT METALLIZATION STRUCTURES FOR INTEGRATED CIRCUIT DEVICES", which is incorporated by reference in its entirety for all purposes.

BACKGROUND

Device density in integrated circuits (ICs) has increased for decades in conformance with Moore's law. However, as the lateral dimensions of a device structure shrink with each technology generation, it becomes increasingly difficult to further reduce structural dimensions.

Interconnection between different levels of metallization within an IC is becoming more difficult as tolerances for misregistration scale with technology generation. Levels of metallization to be interconnected may all be over (or under) a single device layer, or metallization levels may be between multiple device layers for a three-dimensionally (3D) stacked device. For 3D scaling, electrical interconnection of stacked device layers or strata is particularly challenging with respect to misregistration tolerances as lateral dimensions of transistors may be only 20-50 nm, or less, for example.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
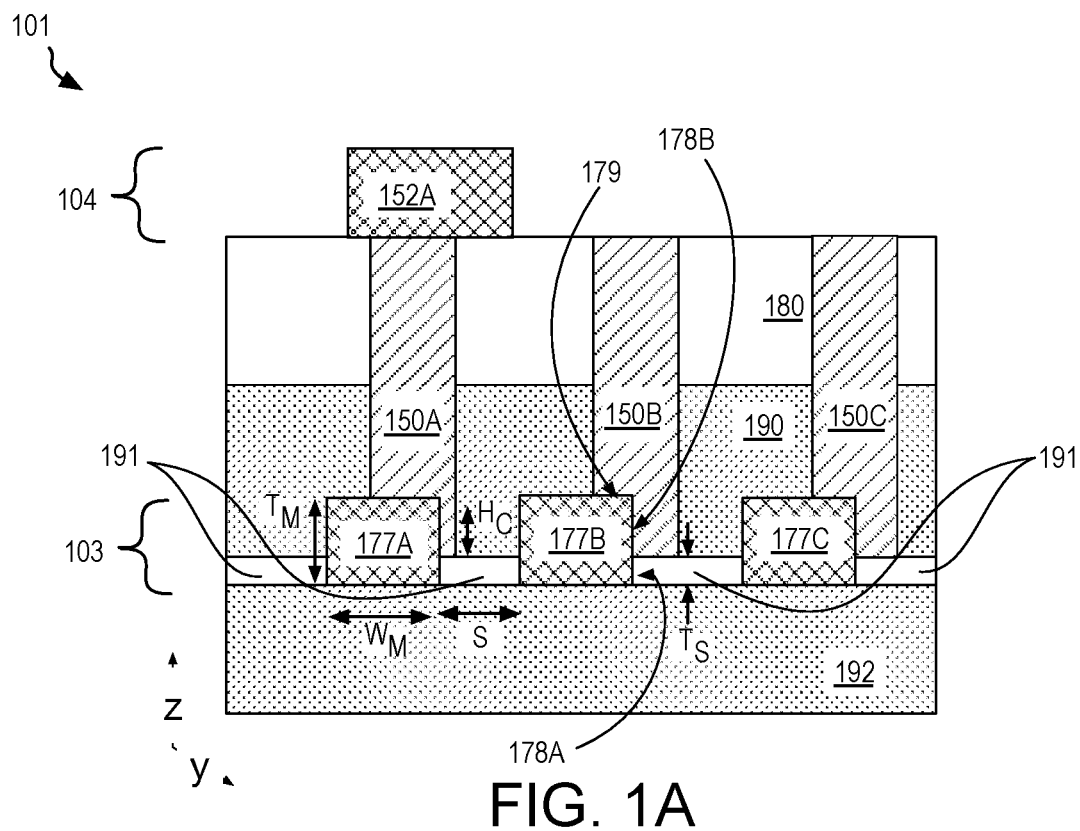
FIG. 1A is a cross-sectional view of an IC with sidewall interconnect structures, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other, without any intermediary materials or devices. "Coupled" may be used to indicated that two or more elements are in either direct or indirect (with other intervening elements between them) physical or electrical contact with each other, and/or that the two or more elements co-operate or interact with each other (e.g., as in a cause an effect relationship), through one or more passive or active intermediary materials or devices.

A "device" may generally refer to an apparatus according to the context of the usage of that term. For example, a device may refer to a stack of layers or structures, a single structure or layer, a connection of various structures having active and/or passive elements, etc. Generally, a device is a three dimensional structure with a lateral x-y plane and a height along the z direction within an x-y-z Cartesian coordinate system. The plane of the device may also be the plane of an apparatus, which comprises the device.

The terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "adjacent" generally refers to a position of a thing being laterally (within an x-y plane) next to (e.g., immediately next to), or adjoining another thing (e.g., abutting it).

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Unless otherwise specified the use of the ordinal adjectives "first," "second," and "third," etc., to describe a common object, merely indicates that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of their use, the terms "substantially equal," "about equal" and "approximately equal" mean that there is no more than incidental variation between among things so described. In the art, such variation is typically no more than +/−10% of a predetermined target value.

As described further below, sidewall interconnect structures are employed to electrically interconnect multiple levels of device interconnect metallization. As used herein, a sidewall interconnect structure contacts at least a conductive sidewall of a feature in a metallization level. A sidewall interconnect structure may be "partially" landed on, or also intersecting, a footprint of the metallization level feature with any overlap between the sidewall interconnect structure and the metallization level feature further increasing the electrical contact area beyond that associated with the sidewall contact. A partially landed sidewall interconnect structure may also be referred to herein as a "wrap-around" contact structure in recognition of the interconnect structure making contact with the sidewall of the metallization level feature in addition to landing on the metallization level feature. Such sidewall interconnect structures in accordance with some embodiments may reduce electrical resistance by providing a larger contact area. Sidewall interconnect structures may also relax registration restrictions relative to what would be required for substantially fully landed interconnect structures. As described further below, sidewall interconnect structures in accordance with some embodiments may be employed within an IC to contact an upper-level metallization feature, and to contact a sidewall of a lower-level metallization feature. Sidewall interconnect structures in accordance with some embodiments may also be employed within an IC to contact a lower-level metallization feature and contact a sidewall of an upper-level metallization feature. Multiple sidewall interconnect structures may contact a sidewall of features in a single metallization level. Some of those sidewall interconnect structures may be in contact with an upper-level metallization feature while other sidewall interconnect structures are in contact with a lower-level metallization feature.

As also described further below, a stop layer may be adjacent to a sidewall portion of a metallization feature to facilitate sidewall interconnect structures while avoiding shorting between laterally or vertically adjacent sidewall interconnect structures. In some exemplary embodiments, a stop layer material is adjacent to a sidewall portion of conductive features of a metallization layer rather than over or under the conductive features. With a stop layer so located relative to the conductive features of a metallization layer, a sidewall interconnect may be formed adjacent to a remaining sidewall portion of the conductive features. The stop layer may therefore ease registration requirements necessary for forming interconnections and may enable low-resistance contacts even when partially landed.

While the sidewall interconnect structures described herein have wide applicability to electrical interconnection of integrated circuitry, in some embodiments described further below, vertically-stacked devices are interconnected through sidewall interconnect structures. For some such embodiments, a terminal interconnect coupled to a gate, source, or drain terminal of a first FET in a vertically-stacked device may be partially landed on a conductive feature of an intervening metallization level between the first FET and an underlying second FET. A portion of the terminal interconnect adjacent to one side of semiconductor of the first FET extends to a depth below a plane of the first FET and intersects a sidewall of the conductive feature. A similar interconnection may be made between the second FET and the conductive feature (or another such feature) of the intervening metallization level. In some such embodiments, a stop layer is located within spaces between adjacent conductive features, allowing terminal interconnects from both the first and second FETs to make low resistance contacts while avoiding electrical shorts between the terminal interconnects of the first and second FETs.

FIG. 1A is a cross-sectional view of an IC interconnect structure 101, in accordance with some embodiments. IC interconnect structure 101 may be found in any integrated circuit, such as, but not limited to, processors, memory, RF transceivers, or electro-optical devices. IC interconnect structure 101 may be located, for example, within levels of interconnect metallization above, below, or between, one or more device layers of an IC. The device layers may include, for example, transistors, such as field effect transistors (FETs), bipolar transistors, or the like. The device layers may include, for example, light emitting and/or light detecting diodes. As shown in FIG. 1A, IC interconnect structure 101 includes a metallization level 103 over a dielectric material 192. Metallization level 103 may be, for example, a back end of line (BEOL) metallization level (e.g., metal 0 through metal 8, etc.). Metallization level 103 may also be, for example, a back-side metallization level that is separated from BEOL metallization levels by an intervening device layer. As further described below, metallization level 103 may also be, for example, a metallization level between two device strata of a stacked IC structure.

Dielectric material 192 may have any composition of suitable dielectric strength for the purpose of electrically isolating laterally adjacent devices and/or vertically adjacent devices. Dielectric material 192 may be any material known to be suitable as an interlayer dielectric (ILD), for example. In some embodiments, dielectric material 192 is a compound of silicon and/or a compound of oxygen, for example, such as, but not limited to, silicon dioxide, silicon nitride, silicon oxynitride, and low-k materials (e.g., having a relative permittivity below 3.3).

Within metallization level 103 there are a plurality of conductive features 177A, 177B, 177C, collectively referred to herein as conductive features 177. Conductive features 177 provide electrical routing within a plane of metallization level 103. Conductive features 177 may be interconnect traces or lines, for example. Conductive features 177 may have any composition having sufficient electrical conductivity to be suitable for electrical interconnection of an IC, such as, but not limited to, an elemental metal or metal alloy. Exemplary elemental metals include Cu, Al, Ru, Ti, W, Co, Ni, Au. Conductive features 177 may also be an alloy of one or more of these metals. Conductive features 177 may also be other metals or have alternative compositions. In the illustrated example, conductive features 177 are on dielectric material 192. As shown in FIG. 1A, conductive features 177 have a metallization thickness $T_M$ and a metallization feature width $W_M$. Metallization thickness $T_M$ may vary with composition and implementation, but in exemplary embodiments metallization thickness $T_M$ is comparable (e.g., within 50%) to metallization feature width $W_M$. In some embodiments, metallization thickness $T_M$ is less than metallization feature width $W_M$. In some alternative embodiments, metallization thickness $T_M$ is greater than metallization feature width $W_M$.

In the example of FIG. 1A, conductive feature 177A is laterally adjacent to conductive feature 177B. A space S is between conductive feature 177A and conductive feature 177B. A dielectric material 191 is within space S. In the example shown, dielectric material 191 is present within each space between conductive features 177. Dielectric material 191 is in contact with a bottom sidewall portion 178A of conductive features 177. Dielectric material 191 has a thickness $T_S$ less than metallization thickness $T_M$. In some exemplary embodiments, dielectric material 191 has a thickness $T_S$ no more than 75% of metallization thickness $T_M$. In some advantageous embodiments, dielectric material 191 has a thickness $T_S$ no more than 50% of metallization thickness $T_M$. Dielectric material 191 may even have a thickness $T_S$ less than 10% of metallization thickness $T_M$. Dielectric material 191 may be any material suitable as an interlayer dielectric (ILD), for example. In some advantageous embodiments, dielectric material 191 is a material suitable as a via etch stop. In some embodiments, dielectric material 191 has a different composition than dielectric material 192. In some exemplary embodiments, dielectric material 191 is a compound of silicon and/or a compound of oxygen, for example, such as, but not limited to, silicon dioxide, silicon nitride, silicon oxynitride, silicon carbide and low-k materials (e.g., having a relative permittivity below 3.3).

IC interconnect structure 101 further includes another metallization level 104 over one or more dielectric materials. Similar to metallization level 103, metallization level 104 may be a back end of line (BEOL) metallization level (e.g., metal 0 through metal 8, etc.). Metallization level 104 may also be, for example, a back-side metallization level that is separated from BEOL metallization levels by an intervening device layer. Metallization level 104 may also be, for example, a metallization level between two device strata of a stacked IC structure.

In the illustrated example, metallization level 104 is separated from metallization level 103 by multiple intervening dielectric materials. A dielectric material 190 is over metallization level 103, and another dielectric material 180 is over dielectric material 190. Dielectric material 190 is on surfaces of conductive features 177 not covered by dielectric material 191. Within space S, dielectric material 190 is on dielectric material 191. Each of dielectric materials 180 and 190 may have any composition of suitable dielectric strength for the purpose of electrically isolating laterally adjacent devices and/or vertically adjacent devices. Dielectric materials 180 and 190 may be any material known to be suitable as an interlayer dielectric (ILD), for example. In some advantageous embodiments where dielectric material 191 is suitable as an etch stop, dielectric material 190 has a different composition than dielectric material 191. In some embodiments, dielectric material 190 is a compound of silicon and/or a compound of oxygen, for example, such as, but not limited to, silicon dioxide, silicon nitride, silicon oxynitride, and low-k materials. In some such embodiments, dielectric material 190 has the same composition as dielectric material 192. Dielectric material 180 may also be a compound of silicon and/or a compound of oxygen, for example, such as, but not limited to, silicon dioxide, silicon nitride, silicon oxynitride, and low-k materials.

Within metallization level 104 there may be a plurality of conductive features 152, with conductive feature 152A serving as one example. Conductive feature 152A is to provide electrical routing within a plane of metallization level 104. Conductive feature 152A may be an interconnect trace or line, for example. In the illustrated example, conductive feature 152A is on dielectric material 180. Conductive feature 152A may have any composition having sufficient electrical conductivity to be suitable for IC interconnection. In some embodiments, conductive feature 152A includes one or more elemental or alloyed metals, such as any of those described above for conductive features 177. In some embodiments, conductive feature 152A has substantially the same composition as conductive features 177.

IC interconnect structure 101 further includes one or more conductive features 150 extending through the one or more dielectric materials separating metallization levels 103 and 104. Conductive features 150 are to provide electrical routing substantially perpendicular to the plane of metallization levels 103 and 104. Conductive features 150 may be conductive interconnect vias, for example. Conductive features 150 may have any composition having sufficient electrical conductivity to be suitable for IC interconnection. In some embodiments, conductive features 150 include one or more elemental or alloyed metals, such as any of those described above for conductive features 152A and 177. In some embodiments, conductive features 150 have the substantially the same composition as one or more of conductive features 152A and 177. Conductive features 150 extend through the thickness (e.g., z-axis) of dielectric material 180 and through the thickness (e.g., z-axis) dielectric material 190. A portion of conductive feature 150A, for example is within a space S between conductive features 177A and 177B. A portion of conductive feature 150B is likewise within a space between conductive features 177B and 177C. The portion of conductive feature 150A within space S is in contact with, intersects, or "lands on" dielectric material 191. A sidewall of conductive feature 150 that is within space S interfaces with a sidewall of conductive feature 177A, making a sidewall contact having a contact height $H_C$. As shown, the sidewall contact height $H_C$ is less than metallization thickness $T_M$ by approximately thickness $T_S$ as a result of both conductive feature 177A and dielectric material 191 being on a substantially planar surface of dielectric material 192. The stop-layer function of dielectric material 191 is evident in that dielectric material 191 has approximately the thickness $T_S$ even below conductive feature 150, which is, for example, indicative of resistance to an etch process employed to form conductive feature 150. In advantageous embodiments, conductive feature 150 does not extend through dielectric material 191 (e.g., through the entire thickness $T_S$). However, the thickness of dielectric material 191 below conductive feature 150 may be somewhat less than $T_S$ as a result of less than ideal etch selectivity.

With conductive feature 150 landing on dielectric material 191, contact resistance between conductive features 177A and 150 is a function of the sidewall contact height $H_C$. This sidewall contact interface may be relied upon exclusively where conductive feature 150 has no lateral overlap with conductive feature 177. Alternatively, as shown in FIG. 1A, a portion of conductive feature 150B makes contact with a top sidewall portion 178B of conductive feature 177B while another portion of conductive feature 150B that overlaps with conductive feature 177B makes contact with a top surface portion 179 of conductive feature 177B. Sidewall contact through top sidewall portion 178B may therefore supplement (e.g., reduce contact resistance) the electrical contact made by top surface portion 179.

As further shown in FIG. 1A, conductive feature 150A is separated from conductive feature 177B by dielectric material 190 that occupies space S between conductive features 177A and 177B. Lateral offset between conductive features 150 and conductive features 177 is limited to some threshold that will avoid conductive feature 150A from shorting to conductive features 177B, for example. With dielectric material 191 occupying space S, and being in contact with a lower sidewall portion of both conductive features 177A and 177B, some thickness dielectric material 191 remains between conductive feature 150 and dielectric material 192 regardless of the magnitude of lateral offset between conductive features 177 and 150. There is therefore little risk of conductive features 150 vertically shorting to any conductive features below metallization level 103.

Figure 1B:
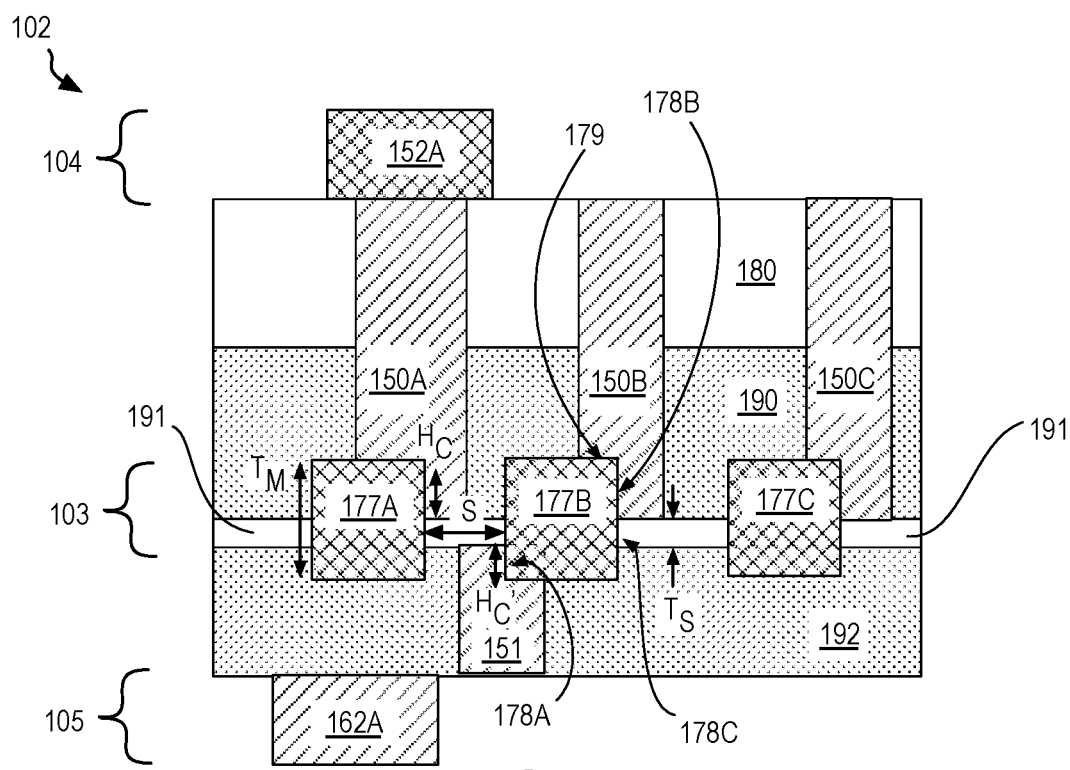
FIG. 1B is a cross-sectional view of an IC with sidewall interconnect structures, in accordance with some embodiments.

FIG. 1B is a cross-sectional view of an IC interconnect structure 102, in accordance with some further embodiments. IC interconnect structure 102 may be considered an extension of IC interconnect structure 101 where features sharing the same reference label have substantially the same attributes, properties, and/or function as described above in the context of FIG. 1A. For IC interconnect structure 102, dielectric material 190 again occupies a location between laterally adjacent conductive features 177A and 177B, however unlike IC interconnect structure 101, the bottom surface of conductive features 177A and 177B are not planar with a surface of dielectric material 191. Instead, dielectric material 191 is adjacent to a central sidewall portion 178C of conductive features 177 with bottom and top sidewall portions 178A and 178B then free to make sidewall contact with a conductive feature that extends from an overlying metallization layer and/or from an underlying metallization layer. For example, as shown in FIG. 1B, conductive feature 150B makes sidewall contact with upper sidewall portion 178B, substantially as described above. Additionally, another conductive feature 151 makes sidewall contact with lower sidewall portion 178A.

Conductive feature 151 extends through the one or more dielectric materials separating metallization level 103 and an underlying metallization level 105. Conductive feature 151 is to provide electrical routing substantially perpendicular to the planes of metallization levels 103 and 105 (e.g., between conductive feature 162A and 177B). Conductive feature 151 may be a conductive interconnect via, for example. Conductive feature 151 may have any composition having sufficient electrical conductivity to be suitable for IC interconnection. In some embodiments, conductive feature 151 includes one or more elemental or alloyed metals, such as any of those described above for conductive features 150, for example. In some embodiments, conductive feature 151 has substantially the same composition as one or more of conductive features 150. Conductive feature 151 extends through the thickness (e.g., z-axis) of dielectric material 192. A portion of conductive feature 151, for example is also within space S between conductive features 177A and 177B. A portion of conductive feature 150B is likewise within a space between conductive features 177B and 177C. The portion of conductive feature 151 within space S is in contact with, intersects, or "lands on" an opposite side of dielectric material 191 from conductive features 150. A sidewall of the portion of conductive feature 151 that is within space S interfaces with a sidewall of conductive feature 177B, making a sidewall contact having a contact height $H_C'$. As shown, the sidewall contact height $H_C'$ is less than metallization thickness $T_M$ by approximately thickness $T_S$ minus sidewall contact height $H_e$. In the illustrated embodiment, conductive feature 177B electrically couples conductive feature 151 with conductive feature 150B while dielectric material 191 electrically isolates conductive feature 151 from conductive feature 150A. Hence, with dielectric material 191 adjacent to a central sidewall portion of a conductive feature, electrical interconnection between metallization levels 104 and 105 is made a function of lateral registration between each of the metallization levels 104 and 105 to metallization level 103. Hence, FIG. 1B illustrates an example with a top-side wrap-around contact (e.g., conductive feature 150A is wrapped around a sidewall of conductive feature 177A) and a bottom-side wrap around contact (e.g., conductive features 151 is wrapped around a sidewall of conductive features 177B. It will be appreciated that conductive features 150A and 151 may be wrapped around the same conductive feature 177 (e.g., 177A), such that a single conductive feature 177 has both top-side and bottom-side wrap-around contacts.

FIGS. 1A and 1B illustrate an embodiment where there is a conductive feature 150 corresponding to each feature 177. In practice, there may be one or more conductive features 177 without a corresponding feature 150. For example, not every feature 177 need have a conductive feature 150 in contact with it, as should be apparent to one skilled in the art.

FIGS. 1A and 1B illustrate embodiments where none of the conductive features 150 are fully landed on conductive features 177 (e.g., where conductive 150 does not intersect the sidewall region of conductive features 177, but rather only contact top surface portion 179). In practice, there may be one or more conductive features 150 that are fully landed upon conductive features 177. Furthermore, a conductive feature 150 might also only intersect the sidewall of a conductive feature 177 without contacting any top surface of the conductive feature 177.

Figure 2:
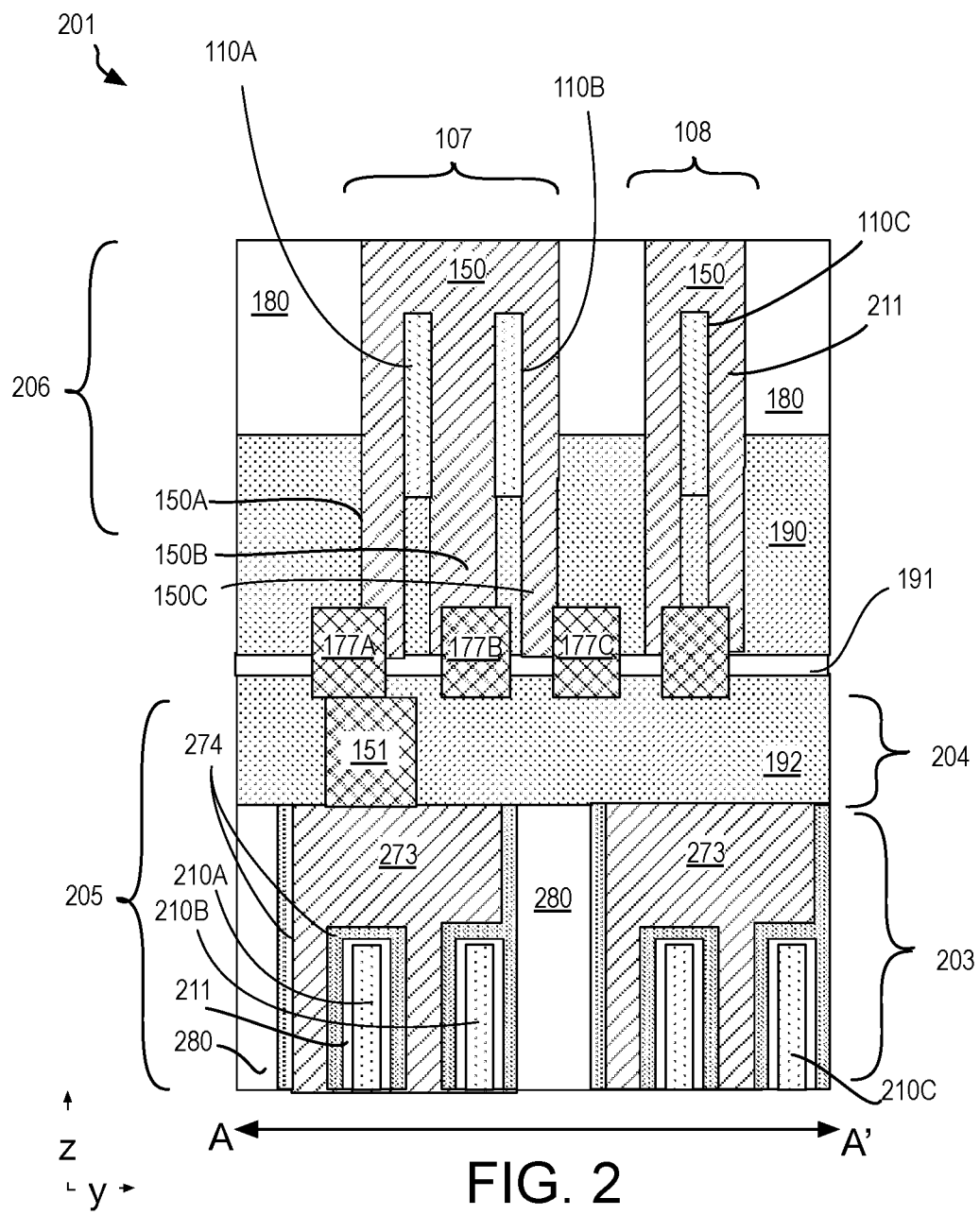
FIG. 2 is a cross-sectional view of a portion of an integrated circuit device including stacked transistors and sidewall interconnect structures, in accordance with some embodiments.

FIG. 2 is a cross-sectional view of a portion of an integrated circuit device 201 that includes stacked device strata 205 and 206, and sidewall interconnect structures, in accordance with some embodiments. IC device 201 may be considered a specific implementation of sidewall interconnect structure 102. In FIG. 2, structural elements or features having the same attributes or properties described above in the context of FIG. 1A and/or FIG. 1B are labeled with the same reference number for the sake of clarity.

In the example shown in FIG. 2, device stratum 205 and device stratum 206 may each include any number of transistors within an arbitrary footprint. In the illustrated example, device stratum 206 includes a multi-fin field effect transistor (FET) 107 and a single-fin FET 108. Device stratum 206 includes two multi-fin transistors. Referring first to device stratum 205, each of FETs 107 and 108 include a gate terminal between source and drain terminals. In some embodiments, source and drain terminals include semiconductor having the same conductivity type (e.g., both n-type or both p-type). In other embodiments, the source and drain terminals include semiconductor having complementary conductivity type (i.e., a tunnel FET, or TFET). The FET may also include a heterojunction (i.e., HFET) and may also qualify as a high electron mobility transistor (HEMT) when the channel comprises a Group III-V or Group III-N material.

In FET 107, conductive features 150 are over a source or drain portion of semiconductor bodies 110A, 110B and 110C. Conductive features 150 may therefore further function as a transistor terminal (e.g., contact) metallization in the illustrated embodiment. For some such embodiments, conductive features 150 may include one or more metals (e.g., Ti, W, Pt, their alloys, nitrides, carbides, etc.) that form an ohmic or tunneling junction with source/drain semiconductor. Source and/or drain semiconductor may be any semiconductor material compatible with FETs, such as, but not limited to, group IV semiconductors (e.g., Si, Ge, SiGe), and/or group III-V semiconductors (e.g., InGaAs, InAs), and/or group III-N semiconductors (e.g., InGaN), and/or (metal) oxide semiconductors. Source and drain semiconductor may include electrically active impurities imparting n-type or p-type conductivity. For some exemplary embodiments, both the source and drain semiconductor is doped to the same conductivity type (e.g., n-type for NMOS and p-type for PMOS). In alternative embodiments (e.g., for a tunneling FET), source and drain semiconductor is doped to have complementary conductivity (e.g., n-type source and p-type drain).

Although out of the plane illustrated in FIG. 2, FETs 107 and 108 include a gate electrode separated from a channel region of semiconductor bodies 110A-110C (e.g., along x-axis). An electrically insulating spacer dielectric, also out of the plane of FIG. 2, may laterally separate the gate electrode from conductive feature 150 and/or source and drain semiconductor. The spacer dielectric may be or any dielectric such as, but not limited to, silicon dioxide, silicon nitride, carbon-doped silicon oxide, carbon-doped silicon oxynitride or silicon oxynitride.

FIG. 2 further shows interlayer interconnection with sidewall device terminal interconnects in accordance with some exemplary embodiments. Device layer or stratum 205 is underlying device stratum 206. Device stratum 205 further includes transistor structures 203 and interconnect metallization 204. Although transistor structures 203 are included in the exemplary embodiment illustrated in FIG. 2, device stratum 205 may alternatively include any other device known to be compatible with an IC (e.g., a volatile or non-volatile memory device, a MEMs, a photodiode, a photovoltaic, etc.)

Transistor structures 203 may have any of the structural features or attributes of FETs 107 and/or 108. For example, as shown in the sectional view illustrated FIG. 2, transistor structures 203 include a gate electrode structure that further includes a gate fill metal 273 and a work function metal 274. This gate structure is over a channel region of semiconductor bodies 210A, 210B and 210C with a gate dielectric 211 between the work function metal 274 and the channel region of semiconductor bodies 210A-210C.

Gate fill metal 273 is one metal of a composite terminal interconnect structure that includes at least two metal regions. Work function metal 274 may have any composition suitable for controlling the channel conductivity of a semiconductor channel. Work function metal 274 may have any suitable work function and may be an elemental metal layer, a metal alloy layer, or even a doped semiconductor (e.g., polysilicon) layer. Work function metal 274 may include at least one P-type work function metal or N-type work function metal, depending on conductivity type of the transistor channel (e.g., NMOS transistors with N-type work function metal and PMOS transistors with P-type work function metal). For PMOS transistors, metals that may be used for work function metal 274 include, but are not limited to, ruthenium, palladium, platinum, cobalt, nickel, and conductive metal oxides (e.g., ruthenium oxide). For NMOS transistors, metals that may be used for work function metal 274 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. Gate fill metal 273 may have any composition known to be compatible for a transistor gate electrode (e.g., having suitable electrical conductivity, adhesion, and fill properties, etc.). FETs 107 and 108 may have a similar gate electrode structure.

Gate dielectric 211 may have any composition and any thickness known to be suitable for transistors having a channel of a given semiconductor composition and operable under given bias conditions. In some embodiments, gate dielectric 211 is a material having a conventional relative permittivity (e.g., k value below 9), such as, but not limited to silicon dioxide, silicon oxynitride, or silicon nitride. In some other embodiments, gate dielectric 211 is a material having a high relative permittivity (e.g., k value above 10). The high-k dielectric material may include elements such as hafnium, silicon, oxygen, titanium, tantalum, lanthanum, aluminum, zirconium, barium, strontium, yttrium, lead, scandium, niobium, and zinc. The high-k material in some embodiments is a metal oxide (e.g., comprising one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate). The high-k material in some embodiments is a metal silicate (e.g., comprising one or more of above metals, oxygen and silicon). In still other embodiments, gate dielectric 211 includes two or more dielectric material layers, such as, but not limited to, a layer with a higher relative permittivity over a layer with a lower relative permittivity. The one or more layers may include silicon oxide, silicon dioxide ($SiO_2$) and/or a high-k dielectric material.

As illustrated in FIG. 2, a gate electrode may be coupled to a sidewall of a channel region of either a multi-fin FET (e.g., semiconductor bodies 210A and 210B), or a single-fin FET (e.g., semiconductor body 210C). In some exemplary embodiments, semiconductor bodies 210A, 210B and 210C include at least one semiconductor channel region, which may have any composition suitable for a field effect transistor. As used herein, "channel region" is a region of a semiconductor body within which a channel is to form during transistor operation. Hence, while a "channel" may not be present until a transistor is appropriately bias, the channel region of the semiconductor body is present at all times as a structural component of a transistor. In some exemplary embodiments, a channel region of semiconductor bodies 210A-C include one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). A channel region of semiconductor bodies 210A-C may also include one or more semiconductor transition metal dichalcogenide (TMD or TMDC) layers. In other embodiments, a channel region of semiconductor bodies 210A-C include one or more graphene layer, or a graphenic material layer having semiconductor properties. In still other embodiments, a channel region of semiconductor bodies 210A-C include one or more oxide semiconductor layers. Exemplary oxide semiconductors include oxides of a transition metal (e.g., IUPAC group 4-10) or post-transition metal (e.g., IUPAC groups 11-14). In advantageous embodiments, the oxide semiconductor includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof. Channel regions of semiconductor bodies 110A-110C may likewise have any of these compositions as well.

In some embodiments, a channel region of semiconductor bodies 210A-C (and/or 110A-C) are substantially monocrystalline. For monocrystalline embodiments, a significant number of crystalline defects may nonetheless be present. In other embodiments, the channel region of semiconductor bodies 210A-C (and/or 110A-C) are amorphous or polycrystalline (e.g., micro or nano crystalline). The channel region of semiconductor bodies 210A-C (and/or 110A-C) may have any width (e.g., y-dimension in FIG. 2). In some exemplary embodiments, the channel region of semiconductor bodies 210A-C (and/or 110A-C) have a width less than 20 nm and advantageously less than 10 nm and more advantageously between 4 nm and 9 nm.

Dielectric materials 180 and 190 surround FETs 107 and 108 with conductive features 150 extending through dielectric material 180 and 190, contacting a sidewall of conductive features 177, and contacting dielectric material 191, substantially as described above in the context of sidewall interconnect structures 101 and 102 (FIGS. 1A and 1B). In some embodiments, dielectric materials 180 and 190 may be the same material. In some embodiments, dielectric materials 180 and 190 may each comprise multiple material layers. Another dielectric material may separate dielectric material 191 from device stratum 205. In the illustrated example, dielectric material 192 is between dielectric material 191 and transistor structures 203 (e.g., gate fill metal 273) with another dielectric material 280 laterally adjacent to transistor structures 203. Dielectric material 280 may have any suitable composition, such as any of those described above for dielectric materials 180 and/or 190. Dielectric material 192 may likewise have any suitable composition, such as any of those described above for dielectric materials 180 and/or 190. In some advantageous embodiments where dielectric material 191 is to serve as a stop layer, dielectric material 192 has a different composition than dielectric material 191. In some such embodiments, dielectric material 190 and 192 have the same composition, different than dielectric material 191.

Notably, FIG. 2 (as wells as FIG. 1A-1B) illustrates embodiments where structures are substantially aligned to Cartesian axes (e.g., device structures having substantially vertical sidewalls). In practice however, positive and negative (re-entrant) sloped feature sidewalls are possible. For example, process non-idealities may cause one or more structural features to have sloped sidewalls. Conductive contacts on feature sidewalls may therefore be further a function of the sidewall slope. Sidewall slopes can result in a contact that is partially landed, and might only intersect a portion of the sidewall of the underlying feature, for example. Hence, in FIG. 2, one or more of conductive features 150A and 177A may have a trapezoidal cross-section or a cross-section with curvature. The conductive feature 150A could therefore intersect a portion of the top of 177A and a portion (but not the entire sidewall) of 177A. In that situation, conductive features 150 may not extend to dielectric layer 191. Thus, attributes described and illustrated herein are idealized merely for the sake of clearly describing salient features.

As shown in FIG. 2, conductive features 150 have a footprint that overlaps semiconductor bodies 110A-110C. Overlapping portions of conductive features 150 are adjacent to, and advantageously in direct contact with, a sidewall of semiconductor bodies 110A-110C. The overlapping portions of conductive features 150 extend below semiconductor bodies 110A-110C and through dielectric material 190 to make contact with at least a sidewall of at least one conductive feature 177. Conductive features 150A and 150B may have a top diameter that is a function of overlap width between conductive feature 150 and semiconductor bodies 110A and 110B. The lateral widths of conductive vias 150A and 150B may therefore differ. Conductive features 150 may function as both a device terminal and a sidewall interconnect to a conductive feature in an underlying layer. For some embodiments where conductive feature 150 contacts sidewalls of a multi-finned device, conductive feature 150 may further include a plurality of conductive features that make at least sidewall contact to at least one underlying conductive feature. Conductive features 150A-150C may electrically couple one device terminal to three different circuit nodes. For example, the three conductive features 150A, 150B and 150C, each contact a sidewall of at least one of semiconductor bodies 110A, 110B. Each of conductive features 150A, 150B and 150C further contact a sidewall of a separate one of conductive features 177A, 177B and 177C. Alternatively, multiple conductive features in contact with a device terminal may further contact one or more sidewall of a single underlying interconnect metallization feature. For example, both conductive features 150A and 150B may couple a single transistor terminal to one other circuit node.

As further shown in FIG. 2, one or more additional metallization levels may be between device strata 205 and 206, for example with conductive feature 177A at least partially landed on a conductive feature 151 and conductive feature 151 in contact with gate fill metal 273. In still other embodiments, one or more conductive features directly couple one or more device terminal with one or more underlying device terminal. For example, in FIG. 2 where device stratum 205 further includes transistor structures 203, one or more of conductive features 150A-150C may be in direct contact with one or more underlying device terminal (e.g. in contact with gate fill metal 273 and/or with a sidewall of work function metal 274). In such embodiments, one or more of conductive features 150A-150C may also couple an overlying laterally offset device terminal directly to a source or drain terminal interconnect that is over a source or drain region of semiconductor bodies 210A-210C. In still other embodiments, one or more conductive vias conductive features 150A-150C may make direct contact with a sidewall of one or more underlying semiconductor bodies (e.g., 210A, 210B, 210C).

Figure 3:
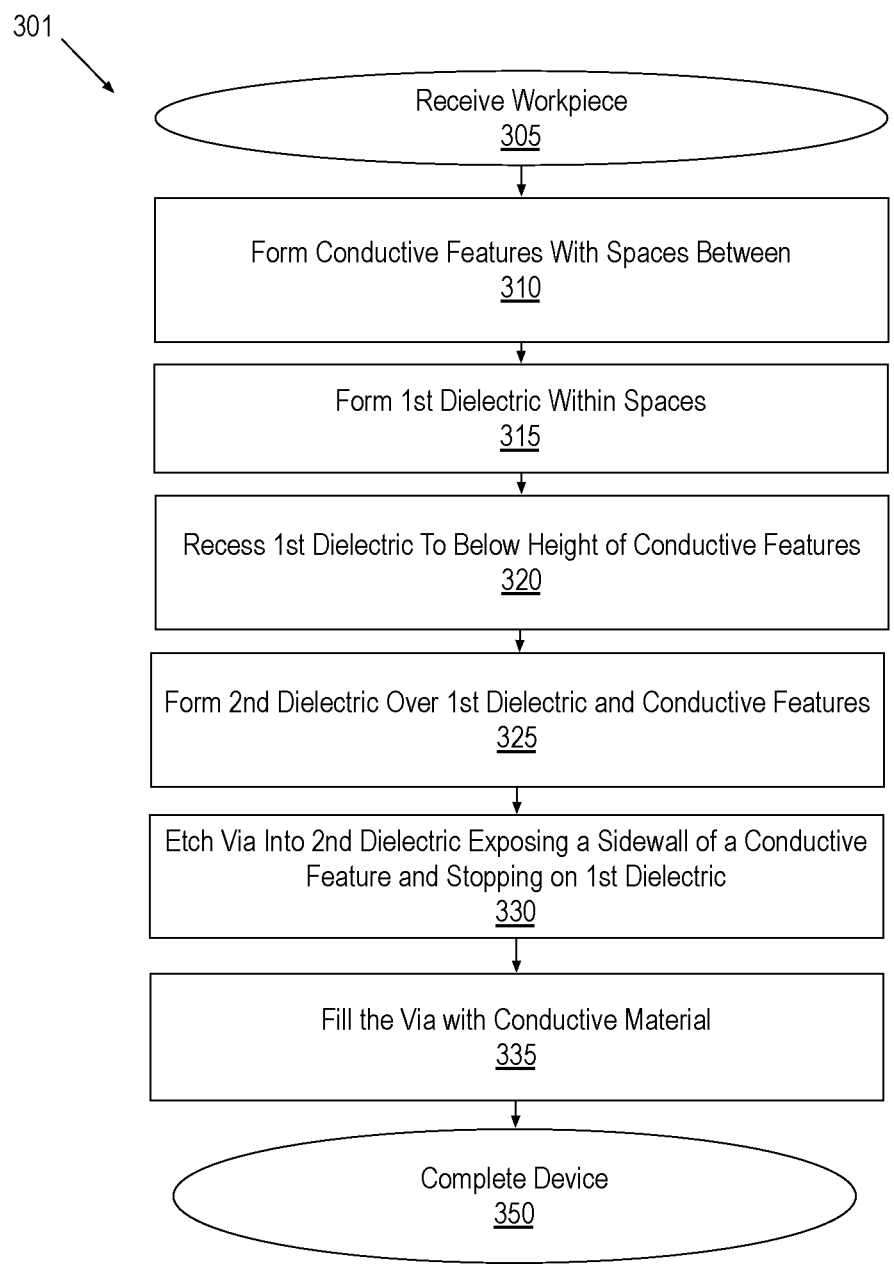
FIG. 3 is a flow diagram illustrating methods for fabricating sidewall interconnect structures, in accordance with some embodiments.

FIG. 3 is a flow diagram illustrating methods 301 for fabricating sidewall interconnects. Methods 301 are suitable for interlayer interconnection of stacked devices, in accordance with some specific embodiments described further below in the context of FIG. 4-12. Methods 301 may be employed, for example, to fabricate the sidewall interconnect structures illustrated in FIGS. 1A and 1B or to fabricate the transistor structures illustrated in FIG. 2, for example.

Referring to FIG. 3, methods 301 begin at operation 305 where a workpiece is received. In some embodiments, the workpiece received at operation 305 includes a semiconductor wafer, such as a large format (e.g., 300-450 mm) silicon wafer. The workpiece may include one or more device layers, for example. The workpiece may further include one or more layers of dielectric material. At operation 310 conductive features are formed on a surface of the workpiece. The conductive features may be fabricated with any techniques known to be suitable for the IC fabrication industry including subtractive patterning and/or additive feature formation. In some embodiments, operation 310 entails a damascene process in which trenches are formed in a dielectric material, metallization is deposited into the trenches and over the dielectric material, and a planarization process planarizes the conductive features with the dielectric material between adjacent features. In some alternative embodiments, operation 310 entails a formation of a metal film over the workpiece and a subtractive patterning process is performed to define the conductive features.

At operation 315, a first dielectric material is formed within spaces between the conductive features formed at operation 310. In some other embodiments where a damascene process was employed to form the conductive features, the first dielectric material is the dielectric material surrounding the conductive features following the damascene process. In some other embodiments where a damascene process was employed to form the conductive features, at operation 315 the dielectric material surrounding the conductive features following the damascene process may be recess etched and the first dielectric material may then be deposited over the conductive features and over the recessed dielectric material to backfill the space between the conductive features. In embodiments where the conductive features were formed with a subtractive patterning process, at operation 315 the first dielectric material may be deposited over the conductive features, backfilling the space between the conductive features.

At operation 320 the dielectric material within spaces between the conductive features is recessed to expose a top sidewall portion of the conductive features, retaining the dielectric material adjacent to a portion of the conductive feature sidewall. In some embodiments, at operation 320 the dielectric material within spaces between the conductive features is first planarized with a top surface of the conductive features, and is then etched back for example with either an isotropic or anisotropic etch process.

With the dielectric material within spaces between the conductive features now at height below that of the conductive features, methods 301 continue at operation 325 where a second dielectric material is deposited over the conductive features and over the first dielectric material. In some advantageous embodiments the second dielectric material backfills the spaces between the conductive features, covers the conductive features. In some exemplary embodiments, the second dielectric material is deposited with a planarizing process (e.g., flowable oxide deposition techniques), and/or separate dielectric deposition and planarization processes (e.g. CMP) are employed to form the second dielectric material.

Methods 301 continue at operation 330 where a via is etched into the second dielectric. The via etch exposes a sidewall of at least one of the conductive features. In advantageous embodiments where the composition of the first and second dielectric materials have different compositions, the via etch process is selective to the second dielectric material and has a sufficiently low etch rate of the first dielectric material to stop on the first dielectric material.

At operation 335, the via formed at operation 330 is filled with a conductive material, such as any metal suitable for IC interconnect metallization (e.g., any of those described elsewhere herein). Any deposition process (e.g., physical vapor deposition, atomic layer deposition, plating, etc.) suitable for the material may be employed at operation 335. Methods 301 then end at operation 350 with completion of the IC device. Operation 350 may include any processing known to be suitable for the fabrication of IC devices, such as any front-end-of-line (FEOL) or back-end-of-line (BEOL) processing. The completed device may then be packaged and/or integrated into a larger system.

Figure 4:
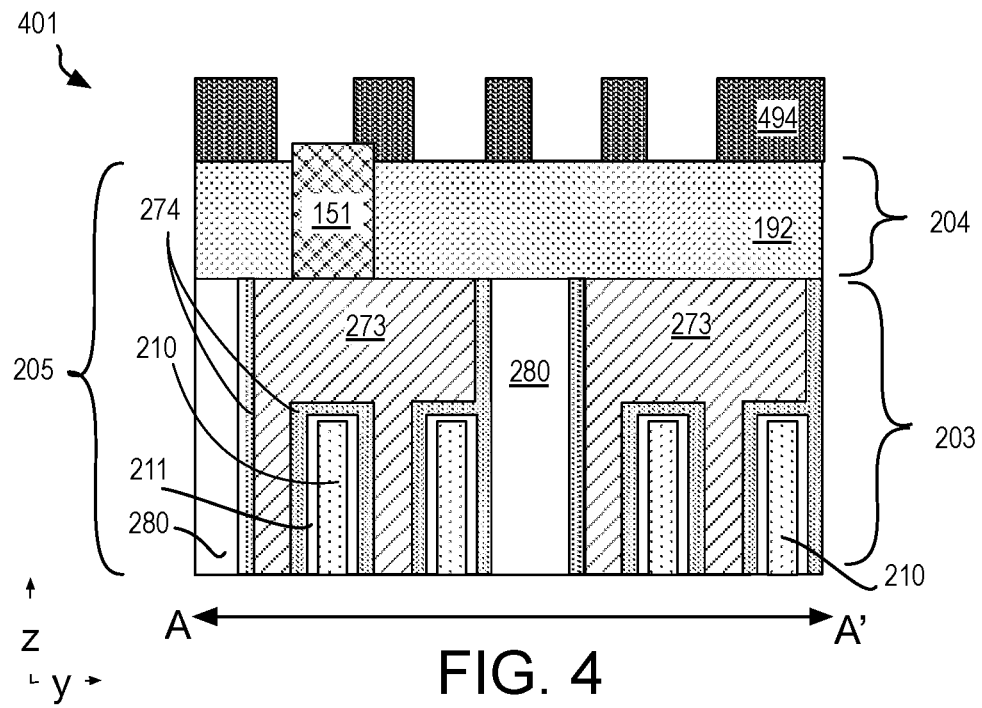
FIGS. 4, 5, 6, 7, 8, 9, 10 and 11 are cross-sectional views illustrating a portion of a device including stacked transistors evolving as selected operations in the methods illustrated in FIG. 3 are practiced, in accordance with some exemplary embodiments.

FIG. 4-11 are cross-sectional views illustrating a portion of a device including stacked transistors evolving as selected operations in the methods illustrated in FIG. 3 are practiced, in accordance with some exemplary embodiments. In FIG. 4 a workpiece received includes an input structure 401 that includes a patterned dielectric layer 494 over device stratum 205. Dielectric layer 494 may be any dielectric material, such as any of those suitable as dielectric material 192. A metallization is then deposited over dielectric layer 494, and planarized with a top surface of dielectric 494. Dielectric material 494 may then be recess etched with an etch process suitable for the dielectric composition.

Figure 5:
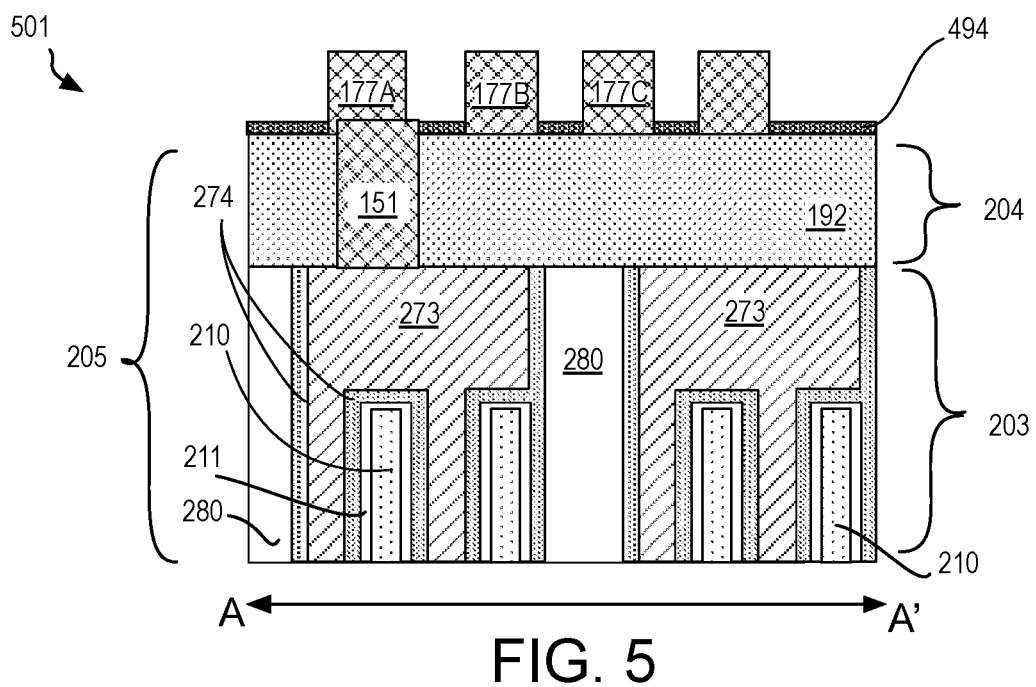

To arrive at the structure 501 illustrated in FIG. 5, an underlying dielectric material (e.g., dielectric material 192) may be deposited and recessed relative to a top surface of conductive feature 151 prior to the deposition of dielectric layer 494. Hence, conductive feature 151 may extend beyond a top surface of dielectric layer 494, such that the bottom dielectric layer 494 is not aligned vertically with bottom of conductive feature 177A.

Figure 6:
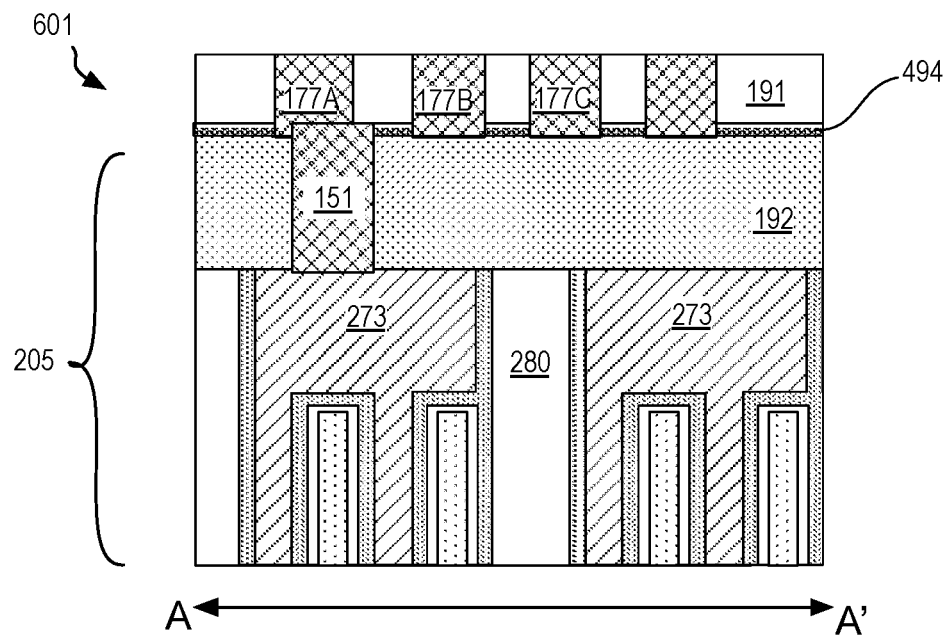
Figure 7:
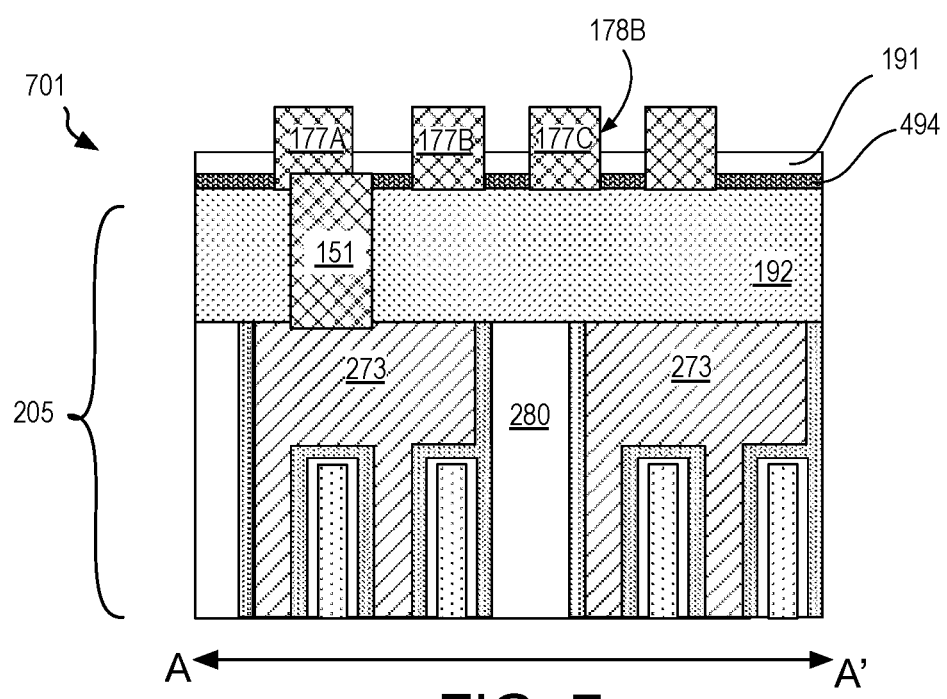

FIG. 6 illustrates an intermediate structure 601 that includes structure 501 following a deposition dielectric material 191. A planarization process may be performed to expose a top surface of conductive features 177 with dielectric material 191 remaining within spaces between conductive features 177. FIG. 7 illustrates an intermediate structure 701 that includes structure 601 following a recess etch of dielectric material 191 to expose upper sidewall portion 178B of conductive features 177.

Figure 8:
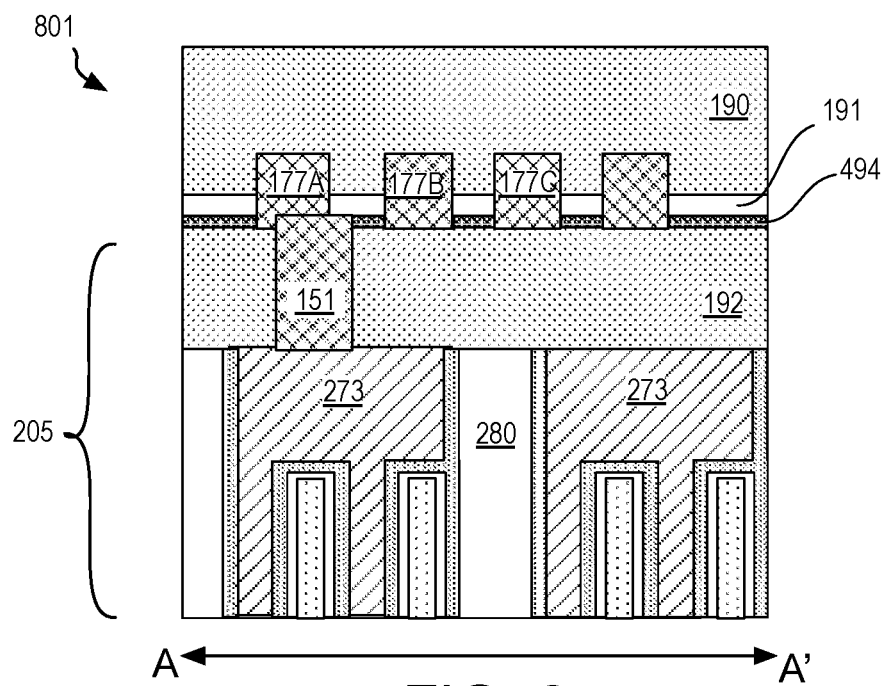

FIG. 8 illustrates an intermediate structure 801 that includes structure 701 following depositing of dielectric material 190. Dielectric material 190 may be deposited with any thin film deposition technique suitable for IC fabrication. Device stratum 206 is then formed over dielectric material 190, as further illustrated in FIG. 9. Device stratum 206 may be iteratively fabricated over device stratum 205, a prefabricated stratum may be bonded to device stratum 205 (e.g., bonded to dielectric layer 190) to arrive at structure 901. Where semiconductor bodies 110A-110C are amenable to thin film deposition processes (e.g., where semiconductor bodies 110A-110C are amorphous or polycrystalline materials) the various structures of device stratum 206 may be fabricated through suitable unit manufacturing processes to arrive at structure 901. Where semiconductor bodies 110A-110C are not amenable to thin film deposition processes (e.g., where semiconductor bodies 110A-110C are monocrystalline) a crystalline layer may be bonded to device stratum 205 with and further processed through suitable unit manufacturing processes to arrive at structure 901. Semiconductor bodies_110A-C may, for example, have been fabricated from a semiconductor on insulator (SOI) substrate, with dielectric material 190 being the insulator layer.

Figure 9:
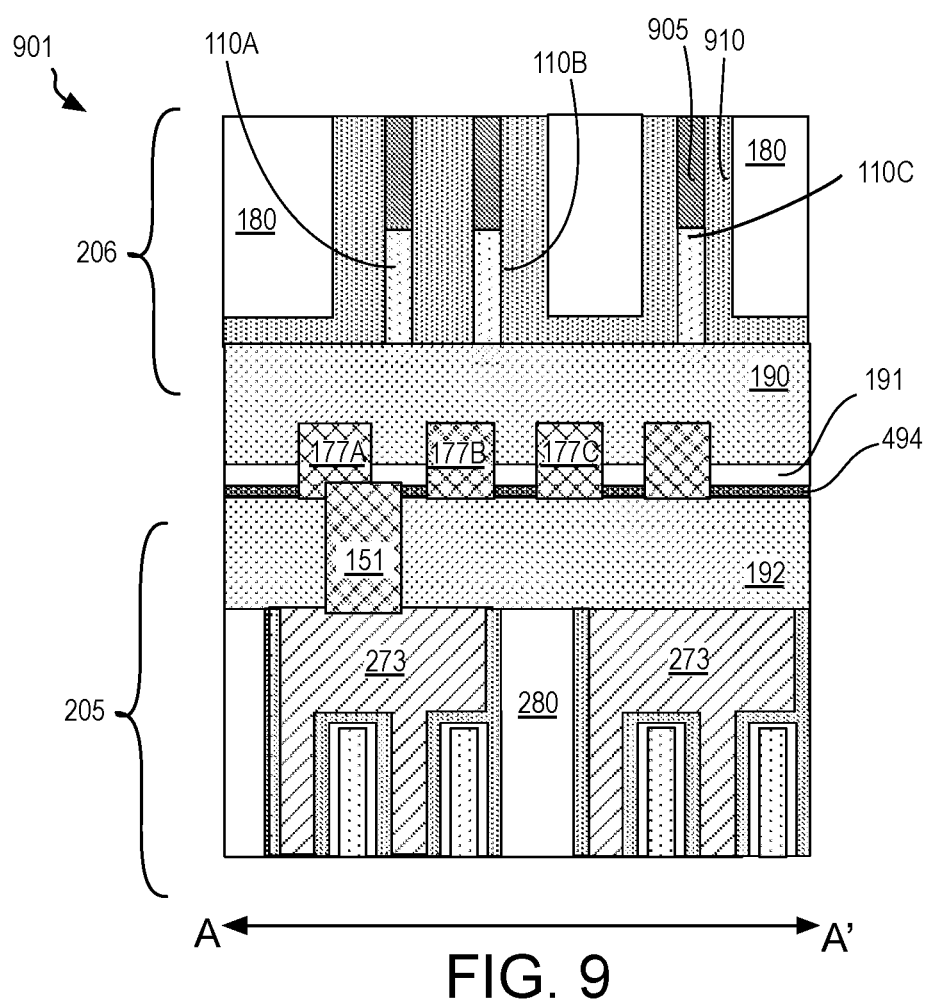

In the example shown in FIG. 9, structure 901 includes a fin mask material 905 and a fin isolation material 910 between semiconductor bodies 110A-110C and dielectric material 180. Fin isolation material 910 may be any material composition suitable for conformal deposition process, such as, but not limited to, silicon dioxide, silicon nitride, and silicon oxynitride. Fin isolation material 910 may be deposited by chemical vapor deposition (CVD), plasma enhanced CVD (PECVD), and atomic layer deposition (ALD), for example. Dielectric material 180 may be formed by any process known to be suitable for the chosen material, such as, but not limited to CVD, PECVD, flowable oxide deposition processes and/or spin-on processes.

Figure 10:
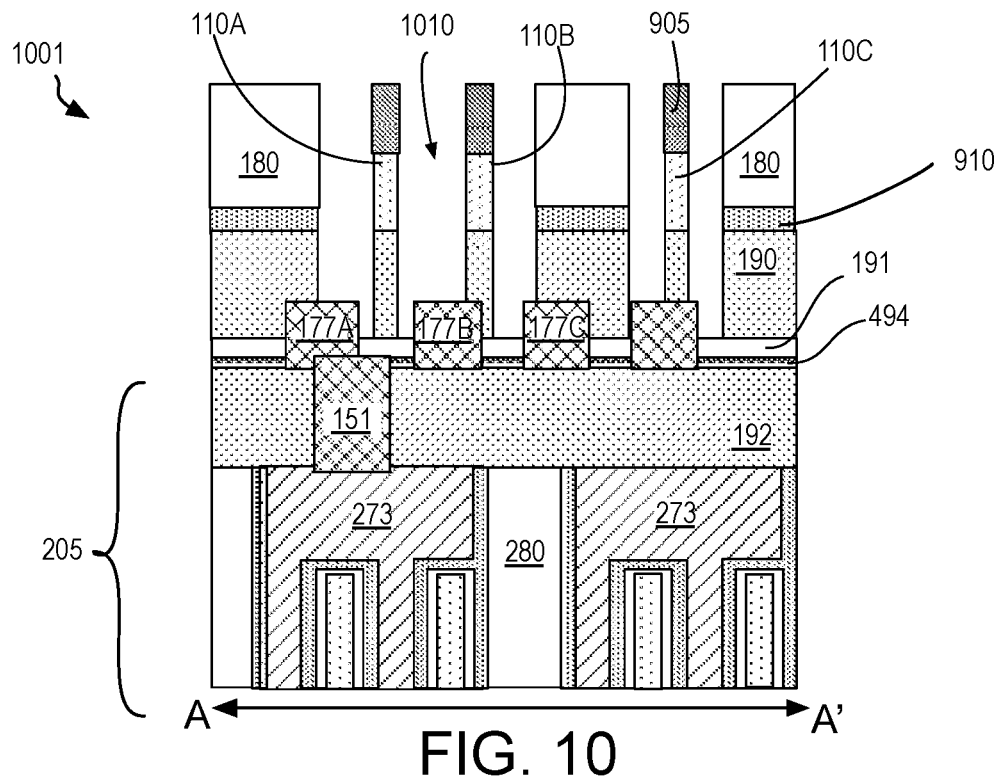

FIG. 10 illustrates an intermediate structure 1001 that includes structure 901 after a portion of fin isolation material 910 is removed selectively to semiconductor bodies 110A-110C and dielectric material 180. Fin isolation material 910 may be selectively removed, for example, with an isotropic or anisotropic etch process that removes fin isolation material 910 at a significantly higher rate than semiconductor bodies 110A-110C and dielectric material 180. At least a portion of the fin isolation dielectric removal may be self-aligned, resulting in the formation of via openings 1010 that follow the profile of fin isolation material 910 between the semiconductor bodies 110A-110C and dielectric material 180. The via etch at operation 330 may therefore be at least partially self-aligned to be adjacent to an edge of the semiconductor bodies 110A-C, and may be further masked by dielectric material 180.

Figure 11:
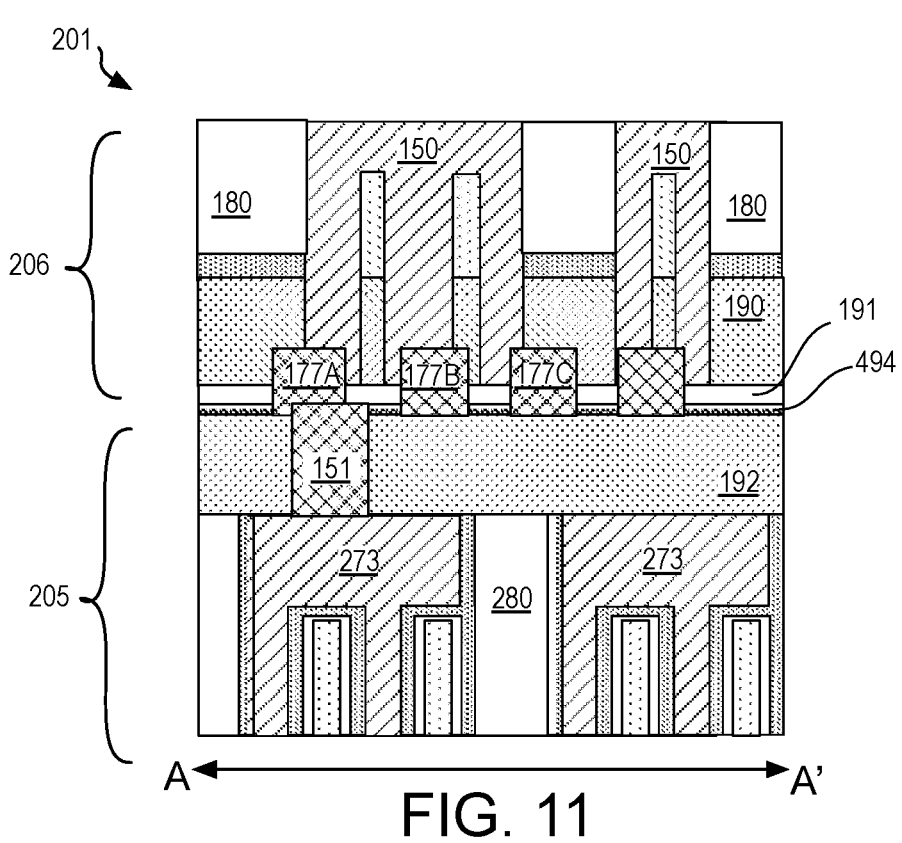

FIG. 11 illustrates integrated circuit device 201, which includes structure 1001 following formation of conductive features 150, and is substantially as described above in the context of FIG. 2. Any processes known to be suitable for depositing metallization material layer(s) may be employed to form conductive features 150. In some examples, one or more dielectric materials may be deposited in conjunction with formation of the device terminal interconnect metallization. Such dielectric materials may be deposited prior to exposing conductive features 177 and once the fin sidewall has been prepared, via openings 1010 may be completed to expose a sidewall of conductive features 177. Terminal interconnect metallization may be deposited into the openings using Any deposition process, plating process, etc. Integrated circuit device 201 is then ready to continue through any desired downstream processing.

In alternative embodiments, structures 401 through 1001 may be fabricated over any suitable substrate, for example according to the operations described above. Subsequently, device stratum 205 may be fabricated, for example through a wafer-level bonding and/or a layer transfer process, and/or back-side substrate thinning One or more features of device stratum 205 may be prefabricated and subsequently transferred to, or joined with, device stratum 206 to arrive at integrated circuit device 201 of FIG. 11. The orientation of devices within device stratum 205 may therefore be the same as those of device stratum 206 (e.g., as illustrated), or devices within device stratum 206 may be inverted relative to devices within device stratum 205. If device stratum 206 is not prefabricated and bonded with device stratum 205, one or more features of device stratum 205 may be fabricated incrementally through back-side processing. For example, in some embodiments, a via may be etching through dielectric material 192 and/or through dielectric material 494 to expose conductive features 177 from the back side. The via may, for example, expose at least a portion of a sidewall of conductive features 177A, as illustrated, and substantially as described for conductive features 150. Conductive feature 151 may further be partially landed in substantially the same manner described above for conductive features 150. Conductive feature 151 may likewise land on the first dielectric material (e.g., substantially as described for conductive features 150).

Figure 12:
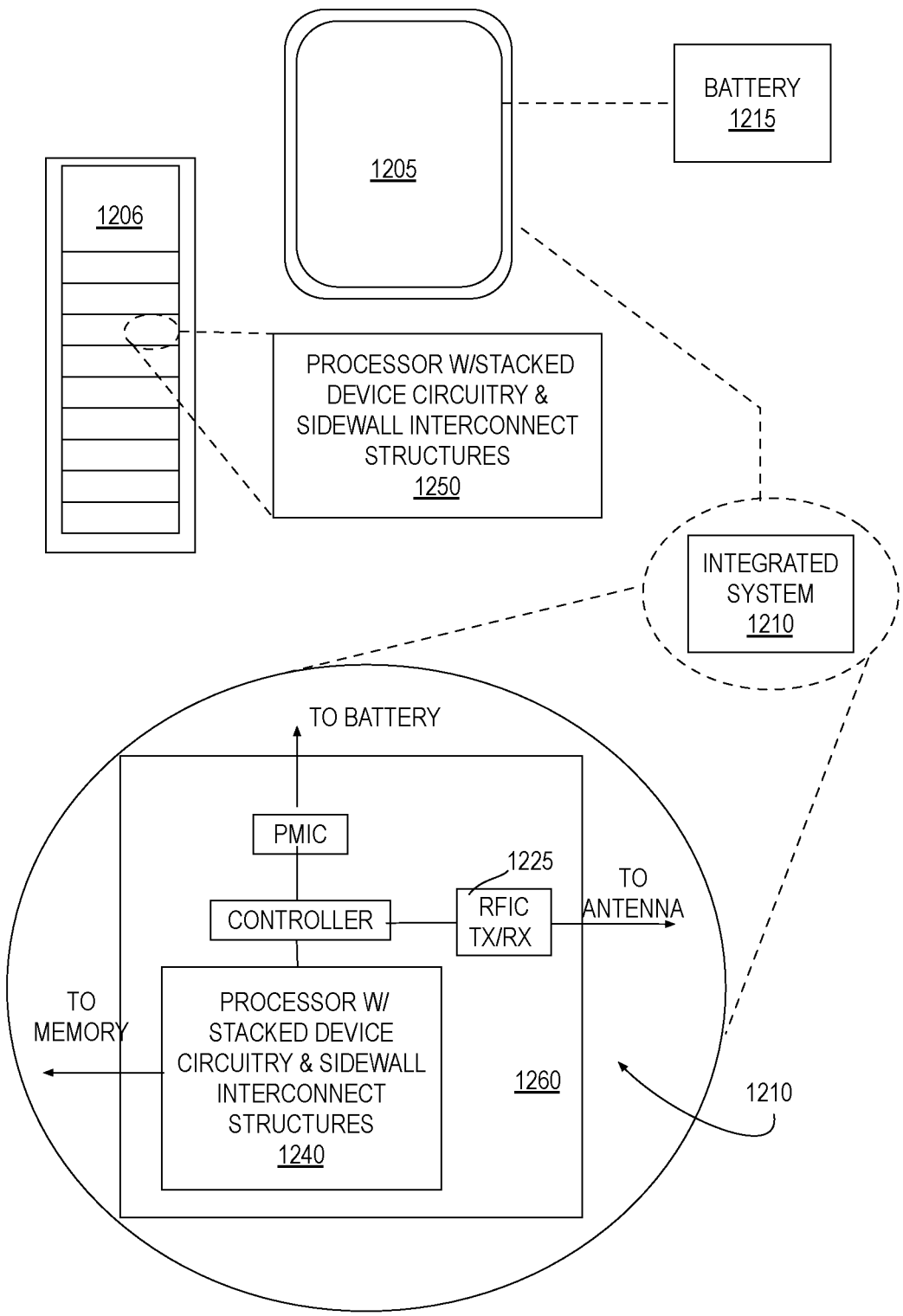
FIG. 12 illustrates a mobile computing platform and a data server machine including a processor with sidewall interconnect structures, in accordance with some exemplary embodiments.

FIG. 12 illustrates a mobile computing platform and a data server machine employing a processor 1250 including stacked device circuitry with sidewall interconnects, for example as described elsewhere herein. The server machine 1206 may be any commercial server, for example including any number of high-performance computing platforms disposed within a rack and networked together for electronic data processing. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215.

Disposed within the integrated system 1210, a substrate 1260 includes stacked processor circuitry 1240 (e.g., a microprocessor, a multi-core microprocessor, graphics processor, or the like). The stacked circuitry may include vertically stacked transistors with sidewall terminal interconnects, for example as described elsewhere herein. For monolithic embodiments, substrate 1260 is a semiconductor chip. For other embodiments, substrate 1260 may be any package substrate, or an interposer. Processor circuitry 1240, or a separate RFIC chip 1225 may be further coupled to an antenna (not shown) to implement any of a number of wireless standards or protocols, including but not limited to Wi-Fi (IEEE 1302.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 13:
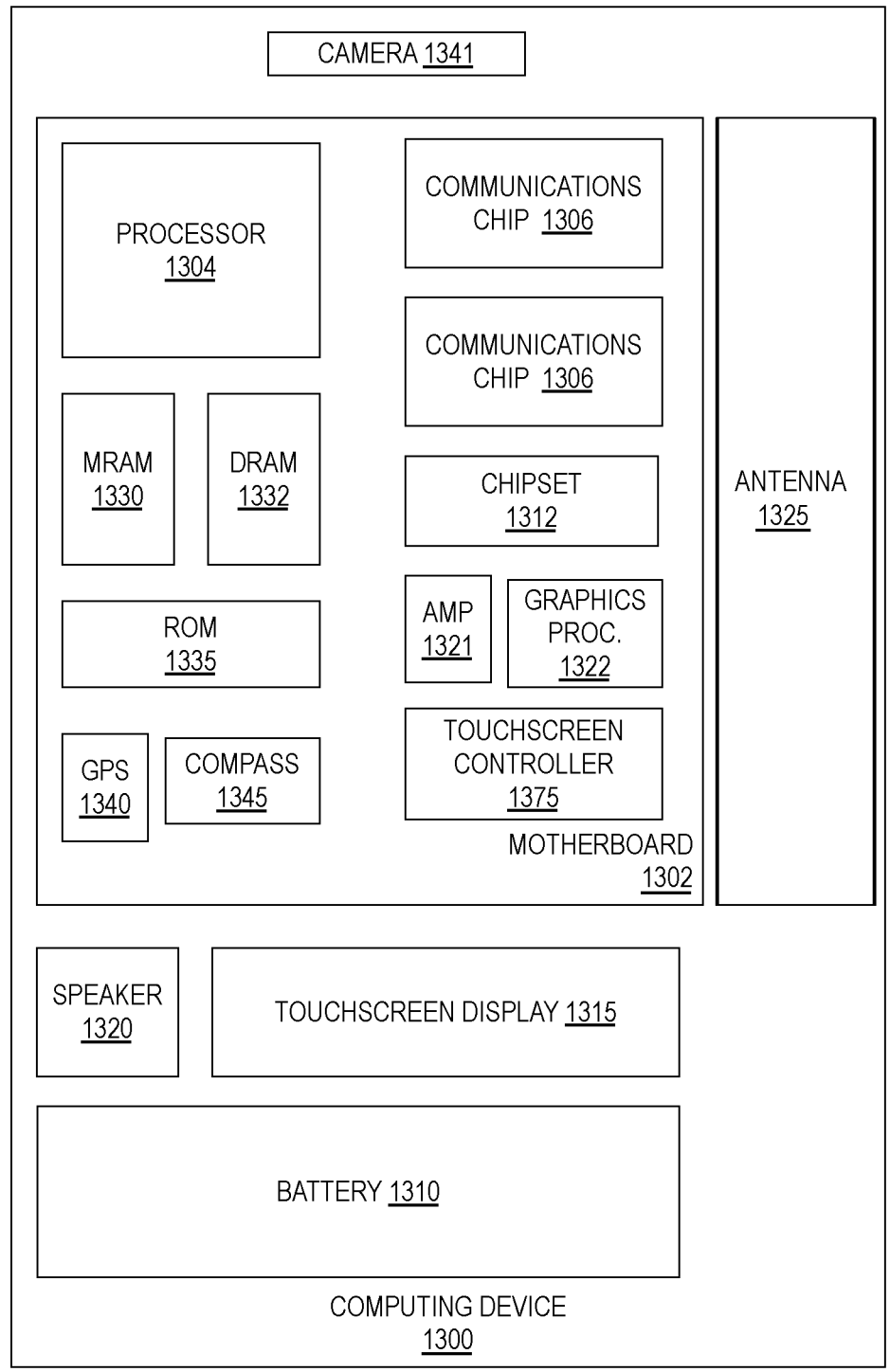
FIG. 13 illustrates a functional block diagram of an electronic computing device, in accordance with some exemplary embodiments.

FIG. 13 is a functional block diagram of an electronic computing device 1300, in accordance with some embodiments. Computing device 1300 may be found inside platform 1205 or server machine 1206, for example. Device 1300 further includes a motherboard 1302 hosting a number of components, such as, but not limited to, a processor 1304 (e.g., an applications processor), which may further incorporate sidewall terminal interconnects, for example in accordance with embodiments described herein. Processor 1304 may be physically and/or electrically coupled to motherboard 1302. In some examples, processor 1304 includes an integrated circuit die packaged within the processor 1304. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., MRAM 1330, DRAM 1332), non-volatile memory (e.g., ROM 1335), flash memory, a graphics processor 1322, a digital signal processor, a crypto processor, a chipset 1312, an antenna 1325, touchscreen display 1315, touchscreen controller 1375, battery 1310, audio codec, video codec, power amplifier 1321, global positioning system (GPS) device 1340, compass 1345, accelerometer, gyroscope, audio speaker 1320, camera 1341, and mass storage device (such as hard disk drive, solid-state drive (SSD), compact disk (CD), digital versatile disk (DVD), and so forth), or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example, the above embodiments may include specific combinations of features as further provided below.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) device, comprising:
a first transistor over a second transistor with an integrated circuit (IC) interconnect structure between the first transistor and the second transistor, the IC interconnect structure comprising:
a first metallization level comprising a first conductive feature and a second conductive feature, wherein the first conductive feature is laterally adjacent to the second conductive feature with a space therebetween;
a first dielectric material within the space and in contact with a first sidewall portion of at least the first conductive feature;
a second dielectric material between the first metallization level and a second metallization level that is over the second dielectric material, wherein the second dielectric material is also within the space; and
a third conductive feature extending through the second dielectric material and on the first dielectric material, wherein at least a portion of the third conductive feature is within the space and is in contact with a second sidewall portion of the first conductive feature.

2. The IC device of claim 1, wherein:
the first dielectric material is in contact with a first sidewall portion of the second conductive feature;
the second dielectric material is in contact with a second sidewall portion of the second conductive feature; and
a portion of the third conductive feature that is within the space is separated from the second conductive feature by the second dielectric material.

3. The IC device of claim 1, wherein:
a portion of the third conductive feature that is within the space is a first portion of the third conductive feature; and
a second portion of the third conductive feature is in contact with a top or bottom surface of at least the first conductive feature.

4. The IC device of claim 1, wherein:
the first conductive feature has a first sidewall height;
the first sidewall portion has a second sidewall height that is no more than 50% of the first sidewall height.

5. The IC device of claim 1, wherein:
the first conductive feature, the second conductive feature and the first dielectric material are between the second dielectric material and a third dielectric material; and
the third conductive feature is separated from the third dielectric material by the first dielectric material.

6. The IC device of claim 1, wherein the first conductive feature is electrically coupled to a terminal of the first or second transistor.

7. A system, comprising:
a processor core; and
a memory array coupled to the processor core, wherein the processor core comprises the IC device of claim 1.

8. An integrated circuit (IC) interconnect structure, comprising:
a first metallization level comprising a first conductive feature and a second conductive feature, wherein the first conductive feature is laterally adjacent to the second conductive feature with a space therebetween;
a first dielectric material within the space and in contact with a first sidewall portion of at least the first conductive feature;
a second dielectric material between the first metallization level and a second metallization level, wherein the second dielectric material extends into the space between the first and second conductive features and is in contact with a sidewall portion of at least the second conductive feature; and
a third conductive feature extending through the second dielectric material, wherein at least a portion of the third conductive feature is within the space and is in contact with a second sidewall portion of the first conductive feature, and wherein:
the first conductive feature, the second conductive feature and the first dielectric material are between the second dielectric material and a third dielectric material;
the third conductive feature is separated from the third dielectric material by the first dielectric material;
a surface of the first and second conductive features is planar with a surface of the first dielectric material; and
the surfaces of the first and second conductive features that are planar with a surface of the first dielectric material are in contact with the third dielectric material.

9. An integrated circuit (IC) structure, comprising:
a first conductive feature laterally adjacent to a second conductive feature with a space there between;
a first dielectric material within the space and in contact with a first sidewall portion of at least the first conductive feature;
a second dielectric material over the first dielectric material;
one or more fins over the second dielectric material, wherein the one or more fins comprise a semiconductor material;
a device terminal interconnect coupled to the one or more fins, wherein the device terminal interconnect comprises one or more metals, and wherein the device terminal interconnect comprises one or more overlapping portions that extend laterally beyond a sidewall of the one or more fins; and
a conductive via that extends through the second dielectric material, wherein the conductive via is in contact with the first dielectric material within the space, and wherein the conductive via couples the device terminal interconnect to at least a sidewall portion of the first conductive feature.

10. The IC structure of claim 9, wherein:
the conductive via is a first conductive via;
the device terminal interconnect is in contact with the first conductive via and a second conductive via;
the first conductive via is in contact with the first conductive feature and the second conductive via is in contact with the second conductive feature;
the second dielectric material is within the space and is in contact with a second sidewall portion of the second conductive feature; and
a portion of the first conductive via that is within the space is separated from the second conductive feature by the second dielectric material.

11. The IC structure of claim 10, wherein:
individual ones of the one or more fins comprise a source region, a drain region, and a channel region therebetween;
the device terminal interconnect is coupled through the first or second conductive features to a gate electrode that is coupled through a gate dielectric to a channel region of one or more second fins under the first dielectric material.

12. The IC structure of claim 10, wherein:
the first conductive feature, the second conductive feature and the first dielectric material are between the second dielectric material and a third dielectric material;
the first conductive via is separated from the third dielectric material by the first dielectric material; and
at least one of the first and second conductive features is further coupled to a second device terminal interconnect below the third dielectric material.

* * * * *